United States Patent
Goto

(10) Patent No.: US 6,236,843 B1
(45) Date of Patent: May 22, 2001

(54) RADIO TERMINAL DEVICE FOR AUTOMATICALLY CORRECTING PHASE DIFFERENCE BETWEEN A RECEIVED SIGNAL AND AN INTERNALLY GENERATED SIGNAL

(75) Inventor: Koji Goto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/106,842

(22) Filed: Jun. 30, 1998

(30) Foreign Application Priority Data

Jan. 26, 1998 (JP) ............................................ 10-012987

(51) Int. Cl.[7] .............................. H04B 1/06; H04B 7/00; H03L 7/00
(52) U.S. Cl. ........................... 455/260; 455/264; 455/262; 455/255; 331/17
(58) Field of Search .................................... 455/260, 255, 455/258, 262, 263, 264, 265, 208, 236.1, 502, 503, 67.4, 67.3, 67.1, 424, 423, 161.1; 375/355, 356, 358; 331/25, 17, 175, 177 R, 177 V, 47, DIG. 2

(56) References Cited

U.S. PATENT DOCUMENTS

| 5,053,723 | * | 10/1991 | Schemmel ................................ 331/14 |
| 5,146,187 | * | 9/1992 | Vandegraaf ............................. 331/17 |
| 5,631,587 | * | 5/1997 | Co et al. ........................... 455/260 X |
| 5,768,696 | * | 6/1998 | Law ....................................... 455/127 |
| 5,787,342 | * | 7/1998 | Tochihara et al. ..................... 455/264 |
| 5,794,130 | * | 8/1998 | Abe et al. .......................... 455/260 X |
| 5,875,388 | * | 2/1999 | Daughtry, Jr. et al. .............. 455/67.1 |
| 5,898,906 | * | 4/1999 | Williams ................................ 455/75 |
| 6,125,267 | * | 9/2000 | Monge-Navarro et al. ....... 455/161.1 |

FOREIGN PATENT DOCUMENTS

61-260184    11/1996  (JP).

* cited by examiner

Primary Examiner—Tracy Legree
(74) Attorney, Agent, or Firm—Leydig, Voit & Mayer, Ltd

(57) ABSTRACT

Radio terminal equipment is provided with an oscillator connected to a receiving circuit, a DPLL 16 for detecting and correcting the phase difference between the received frequency and the oscillation frequency of the oscillator, a switch for connecting a capacitor to or disconnecting from the oscillator, and control means 17 for effecting ON-OFF control of the switch based on the output signal from the DPLL 16.

8 Claims, 10 Drawing Sheets

FIG.6

| VOLTAGE LEVELS AT NODES | | | | SYNTHESIS | CAPACITANCE |
|---|---|---|---|---|---|
| 21a / 22a | 21b / 22b | 21c / 22c | 21d / 22d | | |
| 0 | 0 | 0 | 0 | 0 | 0 |
| 0 | 0 | 0 | 1 | C1/8 | 0.125×C1 |
| 0 | 0 | 1 | 0 | C1/4 | 0.25×C1 |
| 0 | 0 | 1 | 1 | 3×C1/8 | 0.375×C1 |
| 0 | 1 | 0 | 0 | C1/2 | 0.5×C1 |
| 0 | 1 | 0 | 1 | 5×C1/8 | 0.625×C1 |
| 0 | 1 | 1 | 0 | 3×C1/4 | 0.75×C1 |
| 0 | 1 | 1 | 1 | 7×C1/8 | 0.875×C1 |
| 1 | 0 | 0 | 0 | C1 | 1.125 |
| 1 | 0 | 0 | 1 | 9×C1/8 | 1.25×C1 |
| 1 | 0 | 1 | 0 | 10×C1/8 | 1.25×C1 |
| 1 | 0 | 1 | 1 | 11×C1/8 | 1.375×C1 |
| 1 | 1 | 0 | 0 | 3×C1/2 | 1.5×C1 |
| 1 | 1 | 0 | 1 | 13×C1/8 | 1.625×C1 |
| 1 | 1 | 1 | 0 | 7×C1/4 | 1.75×C1 |

RADIO TERMINAL DEVICE FOR AUTOMATICALLY CORRECTING PHASE DIFFERENCE BETWEEN A RECEIVED SIGNAL AND AN INTERNALLY GENERATED SIGNAL

BACKGROUND OF THE INVENTION

1. Field of the Invention

The present invention relates to a radio terminal equipment such as a portable telephone or the like that is provided with an oscillator for use, for example, in semiconductor integrated circuits, more particularly, an oscillator used in fields in which accurate frequencies are needed and, in some cases, certain frequency shifts need to be dealt with.

2. Description of the Prior Art

Conventionally, an oscillator for use in radio terminal equipment of this kind is made up of an oscillation inverter built in a semiconductor integrated circuit, an external or built-in resistor and an external capacitance and crystal oscillator; and its oscillation frequency is fixed.

FIG. 1 is a circuit diagram depicting the configuration of the oscillator used in the traditional radio terminal equipment. Reference numeral 101 denotes an oscillation inverter built in a semiconductor integrated circuit forming radio terminal equipment 104; reference numeral 102 denotes an output pin of the semiconductor integrated circuit to which an output terminal of the inverter 101 is connected; and reference numeral 103 denotes an input pin of the semiconductor integrated circuit to which an input terminal of the inverter 101 is connected.

Reference numeral 105 denotes a feedback resistor that forms part of an oscillator identified generally by 160, the feedback resistor 105 being connected to the output and input pins 102 and 103; reference numeral 106 denotes a crystal oscillator connected in parallel to the feedback resistor 105; and reference numerals 107 and 108 denotes capacitors (capacitances), which are connected between the output pin 102 and a ground level position 109 and between the input pin 103 and the ground level position 109, respectively.

Turning next to FIGS. 2, 3 and 4, the operation of the radio terminal equipment will be described. FIG. 2 is an explanatory diagram showing the mode of communication of the radio terminal equipment, and FIGS. 3 and 4 are frame timing diagrams of the radio system. A base station 111 has an oscillator that oscillates at a fixed frequency fO (Hz), and radio terminal equipment 112 that is a mobile station has the oscillator 160.

Since the oscillator of the radio terminal equipment 112 as a mobile station has such a configuration as mentioned above, it oscillates at a frequency independent of the fixed oscillation frequency of the base station 111. It is desirable that the base station and the mobile station use a system clock of exactly the same oscillation frequency; in practice, however, such various factors as listed below cause a frequency shift in their oscillation.

a. Variations in the performance of crystal oscillators used in the oscillators of the base and mobile stations lead to the variations in oscillation frequency.

b. The oscillation frequency has temperature dependence; the oscillation frequency decreases with an increase in temperature and vice versa. Hence, if the base and mobile stations are in different temperature environments, a considerable difference may sometimes arise between their oscillation frequencies.

c. When the mobile station is moving at high speed, its oscillation frequency as observed from the base station is high or low due to the Doppler effect, depending on whether the mobile station is approaching or going away from the base station.

The oscillation frequencies of the base and mobile stations are caused to differ by various other factors as well.

Let it be assumed that the oscillator 160 of radio terminal equipment 112, used as a first mobile station, is oscillating at a frequency f1 (Hz) a little lower than the oscillation frequency f0 (Hz) of the base station 111 and that the oscillator of radio terminal equipment 112, used as a second mobile station, is oscillating at a frequency f2 (Hz) a little higher than the oscillation frequency f0 (Hz) of the base station 111. When the oscillation frequencies of the base and mobile stations differ as mentioned above, frame timing based on the frequency difference will differ as depicted in FIG. 3. That is, the frame timing of the radio terminal equipment 112 as the first mobile station lags behind the frame timing of the base station 111, whereas the frame timing of the second mobile station 112 leads the frame timing of the base station 111. On this account, the difference in frame timing, even if very small, will accumulate as indicated by W1 and W2 during a long period of time of use; hence, the frame timing of the first and second mobile stations keeps on deviating from the frame timing of the base station 111, resulting in frame-matched, correct transmission and reception becoming impossible.

As a solution to such a problem as referred to above, there has been proposed a method that uses DPLL (Digital Phase-Locked Loop) techniques to correct for the timing deviation by a very small amount of time on a frame-wise basis. In this instance, when the frame-by-frame timing deviations of the first and second mobile stations 112 are smaller in absolute value than a correction value Dt that is a small amount of time, their frame timing follows that of the base station 111. When the absolute values of the timing deviations for each frame exceeds the correction value Dt, the timing deviations will accumulate to such relatively large amounts of time t1 and t2 as shown in FIG. 4. Accordingly, the frame timing of the first and second mobile stations 112 goes on departing from the frame timing of the base station 111; as is the case with the above, no frame-matched, correct transmission and reception are possible and no correct data reception can be expected, either. Another problem is the generation of psychoacoustically uncomfortable noise.

SUMMARY OF THE INVENTION

It is therefore an object of the present invention to provide radio terminal equipment that includes an oscillator which detects from the received frequency the deviation therefrom of the oscillation frequency of the receiving station and controls its own oscillation frequency according to the detected frequency deviation even in a range over which a DPLL is ineffective in correcting the frequency deviation, thereby permitting minimization of the difference between the received frequency from the transmitting station and the oscillation frequency of the receiving station.

To attain the above objective, according to a first aspect of the present invention, there is provided radio terminal equipment that has a switch for connecting therethrough a capacitor to or disconnecting it from the oscillator and control means for effecting ON-OFF control of the switch according to the DPLL output signal. With this arrangement, the difference in oscillation frequency between a base station and the radio terminal equipment as a mobile station can automatically be corrected even in the range over which the frequency difference cannot be corrected by the DPLL—this brings about the effect of preventing a reception error.

According to a second aspect of the present invention, there is provided radio terminal equipment that has control means for effecting selective ON-OFF control of switches each connected to one of a plurality of capacitors according to the DPLL output signal. This ensures avoidance of abrupt capacitance variations, and hence permits control of its oscillation frequency while keeping the oscillator stable in operation.

According to a third aspect of the present invention, there is provided radio terminal equipment that has a plurality of capacitors whose capacitance values differ in steps of C/2n (where n is an integer). This arrangement allows for close capacitance value control, and hence permits control of its oscillation frequency while keeping the oscillator stable in operation.

According to a fourth aspect of the present invention, there is provided radio terminal equipment in which a capacitor has connected thereto a semiconductor switching element whose conduction current can continuously be varied. This allows for continuous control of the oscillation frequency of the oscillator.

According to a fifth aspect of the present invention, there is provided radio terminal equipment that includes a first switch for connecting therethrough a capacitor to or disconnecting from the oscillator, a second switch connected between the capacitor and an intermediate potential position, and control means for alternate ON-OFF control of the first and second switches according to the DPLL output signal. This avoids an extreme or excessive redistribution of charges, and hence permits smooth switching of capacitance values while keeping the oscillator more stable in operation.

According to a sixth aspect of the present invention, there is provided radio terminal equipment that includes a switch for connecting therethrough a capacitor to or disconnecting from the oscillator, a register for storing the phase difference detected by the DPLL, decision means for reading out therefrom the stored phase difference and for deciding a frequency adjustment value, and control means for effecting ON-OFF control of the switch according to the output signal from the decision means. With this arrangement, it is possible to selectively employ a frequency control method in accordance with the kind and temperature and voltage conditions of the oscillator used; hence, appropriate frequency control means can be used in various situations.

BRIEF DESCRIPTION OF THE DRAWINGS

Other objects, features and advantages of the present invention will become more apparent from the following description taken in conjunction with the accompanying drawings, in which:

FIG. 6 is a table showing a composite or combined capacitance value of each capacitor in the first embodiment;

DETAILED DESCRIPTION OF THE PREFERRED EMBODIMENTS

A detailed description will be given, with reference to the accompanying drawings, of preferred embodiments of the present invention.

Embodiment 1

Figure 5:
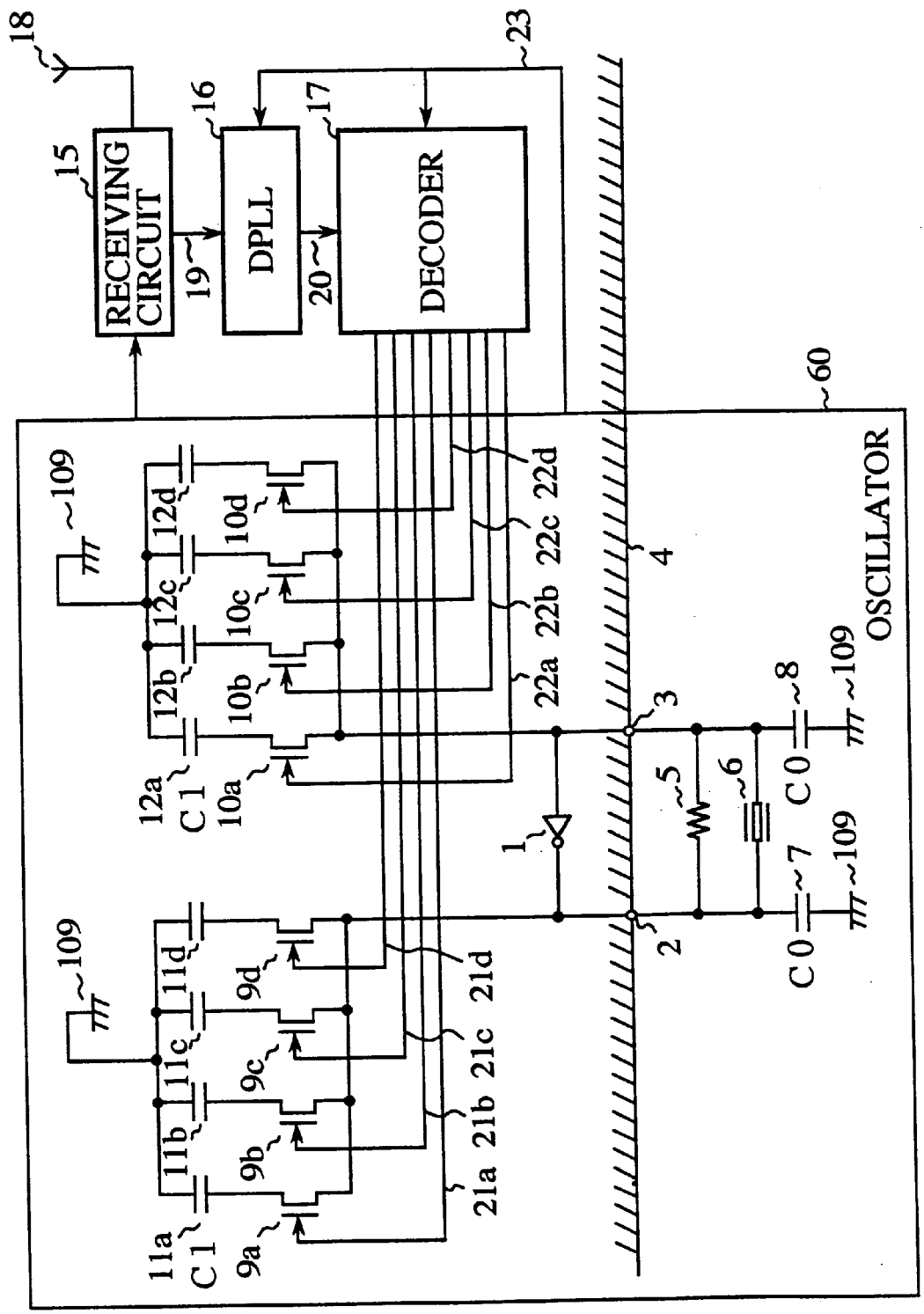
FIG. 5 is a circuit diagram illustrating the configuration of radio terminal equipment provided with an oscillator according to a first embodiment (Embodiment 1) of the present invention.

FIG. 5 is a circuit diagram illustrating the configuration of radio terminal equipment provided with an oscillator according to a first embodiment (Embodiment 1) of the present invention. In FIG. 5, reference numeral 1 denotes an inverter for oscillation built in a semiconductor integrated circuit that forms radio terminal equipment 4. Reference numeral 2 denotes an output pin of the semiconductor integrated circuit to which an output terminal of the inverter 1 is connected. Reference numeral 3 denotes an input pin of the semiconductor integrated circuit to which an input terminal of the inverter 1 is connected.

Reference numeral 5 denotes a feedback resistor that is one of the constituents of an oscillator 60 and is connected between the output and input pins 2 and 3 of the semiconductor integrated circuit. Reference numeral 6 denotes a crystal oscillator connected in parallel to the feedback resistor 5. Reference numerals 7 and 8 denote capacitors, which are connected between the output pin 2 and a ground level position 109 and between the input pin 3 and the ground level position 109, respectively.

Reference numerals 9a to 9d denote N-channel MOS transistors (hereinafter referred to simply as NchTr's), each of which serves as a switch for connecting therethrough the output pin 2 of the semiconductor integrated circuit to the one electrode of one of capacitors 11a to 11d of a capacitance C1. The other electrodes of the capacitors 11a to 11d are connected to the ground level position 109. The NchTr 9a to 9d, serving as switches, have their control terminals connected to output terminals 21a to 21d of a decoder 17 serving as control means, and are turned ON or OFF according to voltage levels at the output terminals 21a to 21d.

Reference numerals 10a to 10d denote other N-channel MOS transistors (also hereinafter referred to simply as NchTr), each of which functions as a switch for connecting therethrough the input pin 3 of the semiconductor integrated circuit to the one electrode of one of capacitors 12a to 12d. The other electrodes of the capacitors 12a to 12d are connected to the ground level position 109. The NchTr 10a to 10d, which function as switches, have their control terminals connected to output terminals 22a to 22d of the decoder 17, and are turned ON or OFF according to voltage levels at the output terminals 22a to 22d.

Reference numeral 23 denotes a signal line for transmitting a clock signal for the use of operating the circuit blocks connected to the line.

The decoder 17 decodes a control signal 20 provided from a DPLL 16, and applies control signals to the output terminals 21a to 21d and 22a to 22d. Reference numeral 15 denotes a receiving circuit (RF) that extracts a bit stream from radio waves received by an antenna 18 and provides received data onto an output line 19. The DPLL 16 operates on a system clock of the oscillation frequency of the oscillator 60, and detects the amount of departure of the oscillation frequency of the mobile station 112 from that of the base station. The DPLL 16 supplies the decoder 17 with the control signal 20 for delaying or advancing the phase of operation of the mobile station 112, depending on whether it leads or lags behind the phase of the base station 111.

Next, a description will be given of the operation of the mobile station provided with the oscillator according to Embodiment 1.

Figure 1:
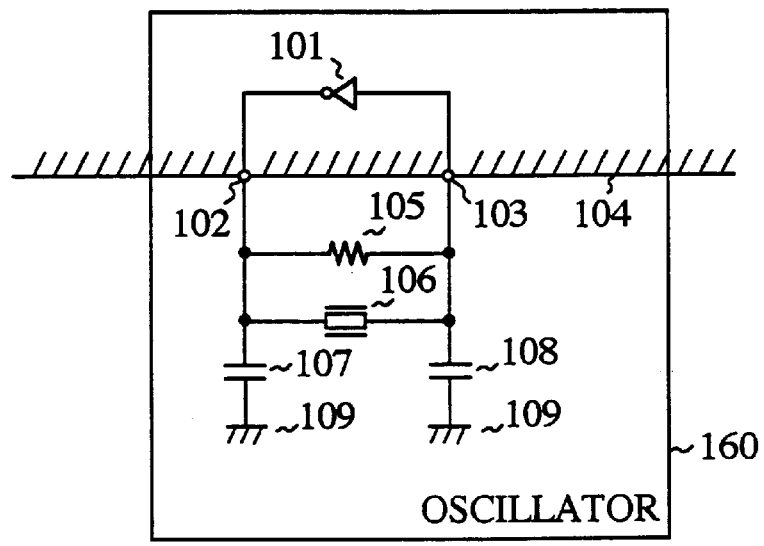
FIG. 1 is a circuit diagram depicting an example of a conventional oscillator.
Figure 2:
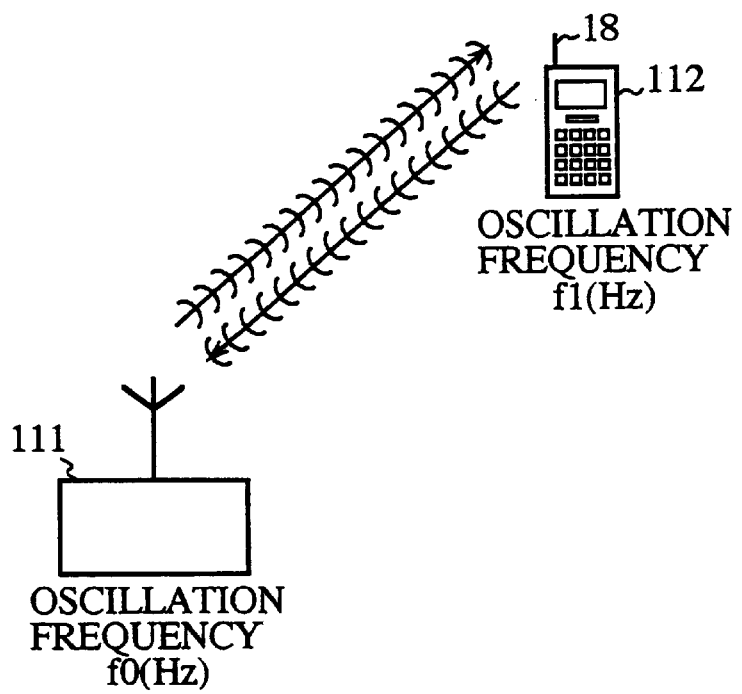
FIG. 2 is an explanatory diagram showing the mode of communication by radio terminal equipment.
Figure 3:
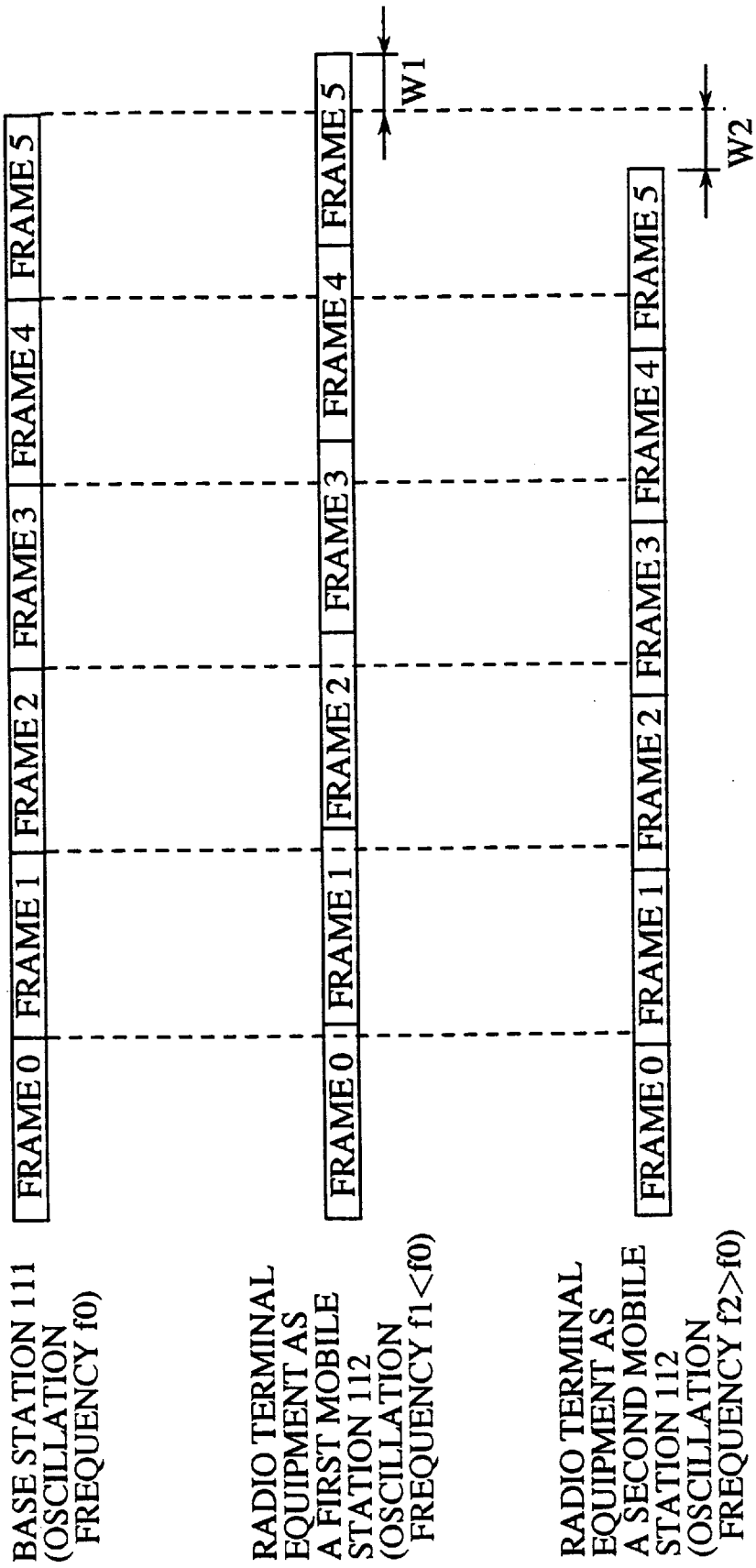
FIG. 3 is a diagram showing an example of the relationship between a base station and radio terminal equipment as a mobile station in terms of frame timing based on their oscillation frequencies.
Figure 4:
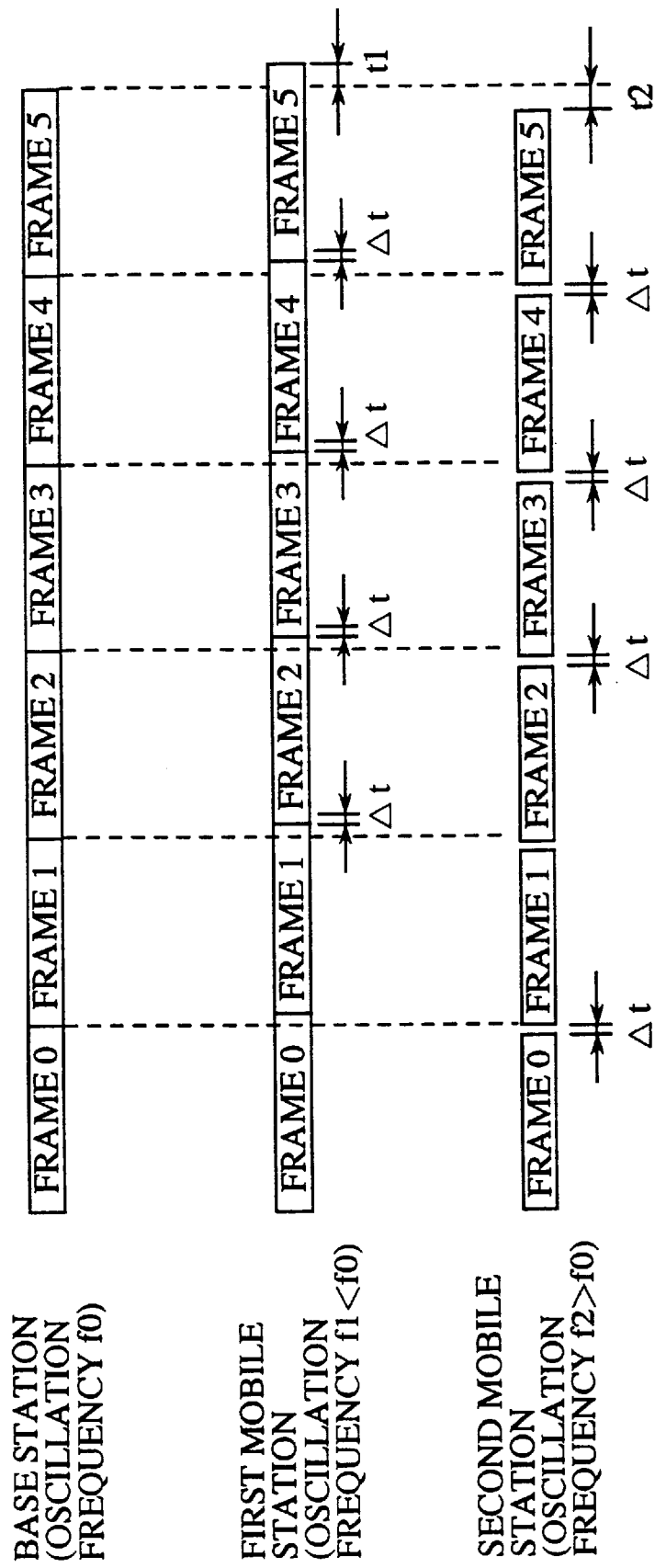
FIG. 4 is a diagram showing another example of the relationship between a base station and radio terminal equipment as a mobile station in terms of frame timing based on their oscillation frequencies.

The base station 111 has an oscillator that oscillates at the frequency f0 very close to the normalized frequency, and the mobile station also has an oscillator that oscillates at the frequency f1 very close to the normalized frequency, as shown in FIGS. 3 and 4. As referred to previously, however, the oscillation frequency of any oscillator varies delicately because of variations in the characteristic of the crystal oscillator used and in the power-supply voltage, for instance.

The mobile station 112 receives radio waves from the base station 111 by the antenna 18. The received radio waves are clocked into demodulated form by a PLL circuit (not shown) in the receiving circuit 15, from which a bit stream of the received data is extracted. The thus extracted bit stream of the received data is provided via the data output line 19 to the DPLL 16. The DPLL 16 extracts a communication frame from the received data, and always makes comparison between the phase of a communication frame of the mobile station 112 running free based on the system clock of its own and the phase of the received data with the precision of the system clock. By this, the DPLL 16 detects a phase lag or lead of the communication frame of the mobile station 112 relative to the phase of the received data.

The DPLL 16 provides a control signal via the signal line 20 to the decoder 17 to delay or hasten the timing of the communication frame of the mobile station, depending on whether its phase is leading or lagging behind the phase of the received data.

However, when the system clocks of the mobile station 112 and the base station 111 get out of phase at a rate faster than a certain value, the phase control cannot precisely follow or catch up with the phase deviation. The reason for this is that the DPLL 16 is incapable of effecting phase control with a precision higher than that of the system clock of the mobile station 112 as referred to previously with respect to FIG. 4. In this instance, no synchronization can be obtained between the communication frames of the mobile and base stations 112 and 111, and a reception error arises accordingly, resulting in significant loss of speech quality.

To avoid this, in Embodiment 1 the phase of the communication frame of the mobile station 112 running free based on the system clock of its own and the phase of the received data are compared by the DPLL 16 for a long time. The DPLL 16 detects how many pulses of the system clock the received data is out of phase with the communication frame of the mobile station 112 and the frame intervals at which the phase deviation occurs. The DPLL 16 provides the detected values in coded form as a correction signal to the decoder 17 via the signal line 20. Based on the correction signal from the DPLL 16, the decoder 17 is capable of judging that the system clock of the mobile station 112 is going out of phase with the system clock of the base station 111 at a rate:

Number of system clocks corresponding to the phase shift/Frame observation time

Thus, it is possible to detect the phase deviation rate with appreciably higher precision than in the case of using the system clock.

When it is determined that the phase of the mobile station 112 is shifting from the phase of the base station 111 very fast in the direction to lead the latter, the decoder 17 makes all of the output terminals 21a to 21d and 22a to 22d high-level. By this, the NchTr 9a to 9d and 10a to 10d are turned ON. Accordingly, the capacitors 11a to 11d and 12a to 12d are connected to the output pin 2 and the input pin 3, respectively. As the result of this, the capacitances connected to the oscillator increase and the oscillation frequency lowers correspondingly.

In contrast to the above, when it is determined that the phase of the mobile station 112 is shifting from the phase of the base station 111 very fast in the direction to lag behind the latter, the decoder 17 makes all of the output terminals 21a to 21d and 22a to 22d low-level. By this, the NcTr's 9a to 9d and 10a to 10d are turned OFF. Accordingly, the capacitors 11a to 11d and 12a to 12d are disconnected from the output pin 2 and the input pin 3, respectively. As the result of this, the capacitance connected to the oscillator decreases and the oscillation frequency rises correspondingly.

By repeating the processing according to Embodiment 1, the system clocks of the mobile and base stations 112 and 111 can ultimately be adjusted or controlled by the capacitors 11a to 11d and 12a to 12d, and the system clocks are corrected even in the range over which they cannot be corrected by the DPLL 16. Hence, it is possible to minimize the deviation of the oscillation frequency from that of the base station 111.

Embodiment 2

In the Embodiment 1 described above, the decoder 17 effects ON-OFF control of the output terminals 21a to 21d and 22a to 22d at the same time. When all the output terminals are simultaneously switched from high to low or vice versa, however, the capacitances connected to the oscillator, four in the illustrated example, change instantaneously from C0+C1/4 to C0 or vice versa.

This causes an abrupt change in the capacitances connected to the oscillator, making the operation of the oscillator unstable temporarily. A second embodiment (Embodiment 2) of the present invention is intended to obviate this problem. According to this embodiment, when the phase of the mobile station 112 is deviating from the phase of the base station 111 but not so fast, the decoder 17 makes one or more of the output terminals 21a to 21d and the output terminals 22a to 22d high- and low-level, respectively, in accordance with the phase deviation rate. By this, some of the capacitors 11a to 11d and the capacitors 12a to 12d are connected to the output pin 2 and the input pin 3, respectively, causing the capacitance variations to occur at sufficiently long time intervals. Thus, the capacitance that is connected to the oscillator is controlled in accordance with the phase deviation rate.

As described above, according to Embodiment 2, it is possible to avoid a sharp capacitance change of the oscillator and hence control the oscillator while maintaining the oscillator stable in operation.

Embodiment 3

In the Embodiment 1 described above, the capacitors 11a to 11d and 12a to 12d all have the same capacitance values C1. In this instance, the oscillation frequency cannot be tuned finely in excess of the capacitance value C1. In view of this, a third embodiment (Embodiment 3) of the present invention adapts the oscillator so that its oscillation frequency can be tuned more finely. To this end, the capacitance values of the capacitors 11a to 11d and 12a to 12d are set as follows:

11b: C1/2

11c: C1/4

11d: C1/8

12a: C1

12b: C1/2

12c: C1/4

12d: C1/8

As described above, according to Embodiment 3, fine capacitance tuning can be achieved by setting the capacitance of each capacitor at a value different from C1/2n (where n is an integer). A combined or composite capacitance in this case is such as shown in the table of FIG. 6. When eight capacitors are used, the oscillation frequency can be tuned to a maximum of C1/8 levels.

Embodiment 4

Figure 7:
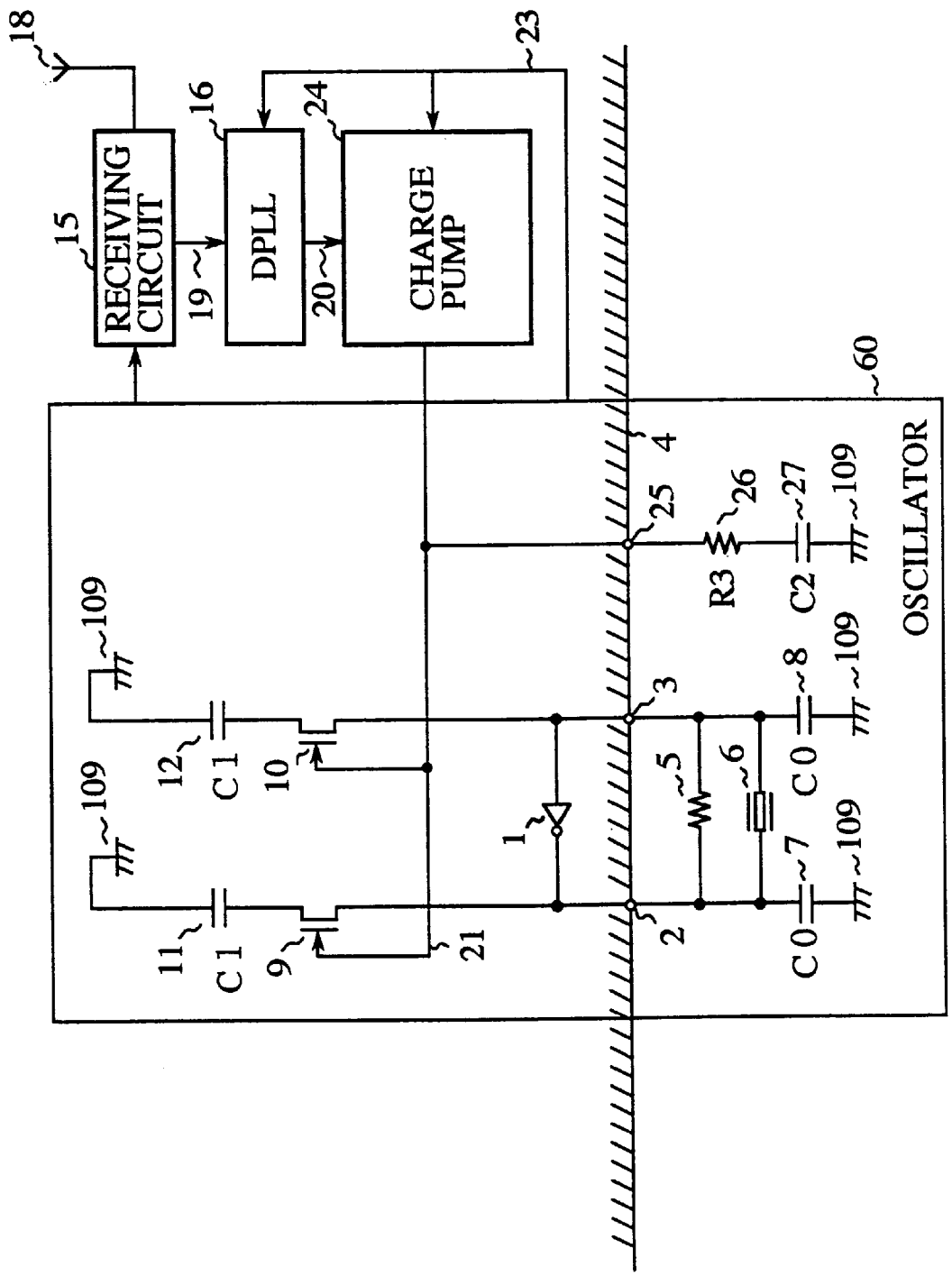
FIG. 7 is a circuit diagram illustrating the configuration of radio terminal equipment provided with an oscillator according to a fourth embodiment (Embodiment 4) of the present invention.

FIG. 7 is a circuit diagram depicting the configuration of radio terminal equipment provided with an oscillator according to a fourth embodiment (Embodiment 4) of the present invention. The parts corresponding to those in FIG. 5 are identified by the same reference numerals and no detailed description will be given of them. In FIG. 7, reference numerals 11 and 12 denote capacitors of the capacitance value C1. The capacitors 11 and 12 are connected between the ground level position 109 and the NchTr 9 and between the ground level position 109 and the NchTr 10, respectively. Reference numeral 24 denotes a charge pump.

Figure 8:
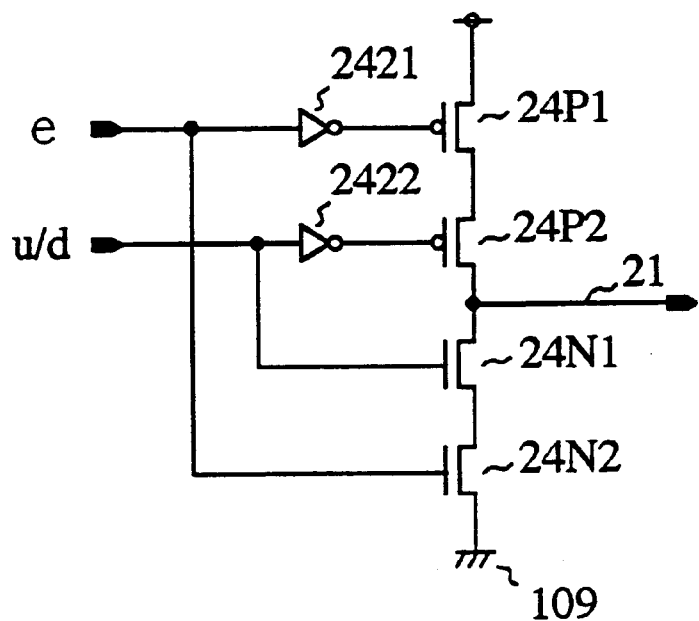
FIG. 8 is a circuit diagram depicting an example of a charging pump used in FIG. 7.

FIG. 8 is a circuit diagram showing an example of the charge pump 24, which is made up of series-connected PchTr's 24P1, 24P2 and NchTr's 24N1, 24N2 and inverters 2421 and 2422 connected to control terminals of the PchTr's 24P1 and 24P2, respectively.

Figure 9:
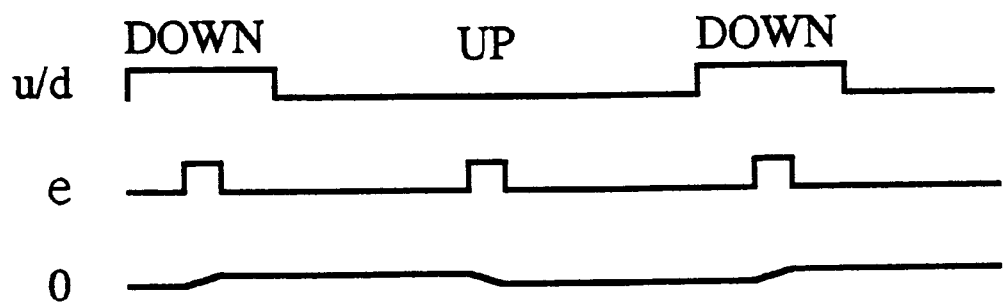
FIG. 9 is a timing chart of the operation of a charging pump shown in FIG. 8.

FIG. 9 is a diagram showing the operation timing of the charge pump 24. Reference character u/d represents an up-down signal for indicating whether to charge or discharge the electrical charge at the output terminal 21; the high level indicates charging and the low level discharging. Reference character e represents an enable signal that is used to determine the charging or discharging period; only while the enable signal e is high-level, the charging or discharging takes place.

Figure 10:
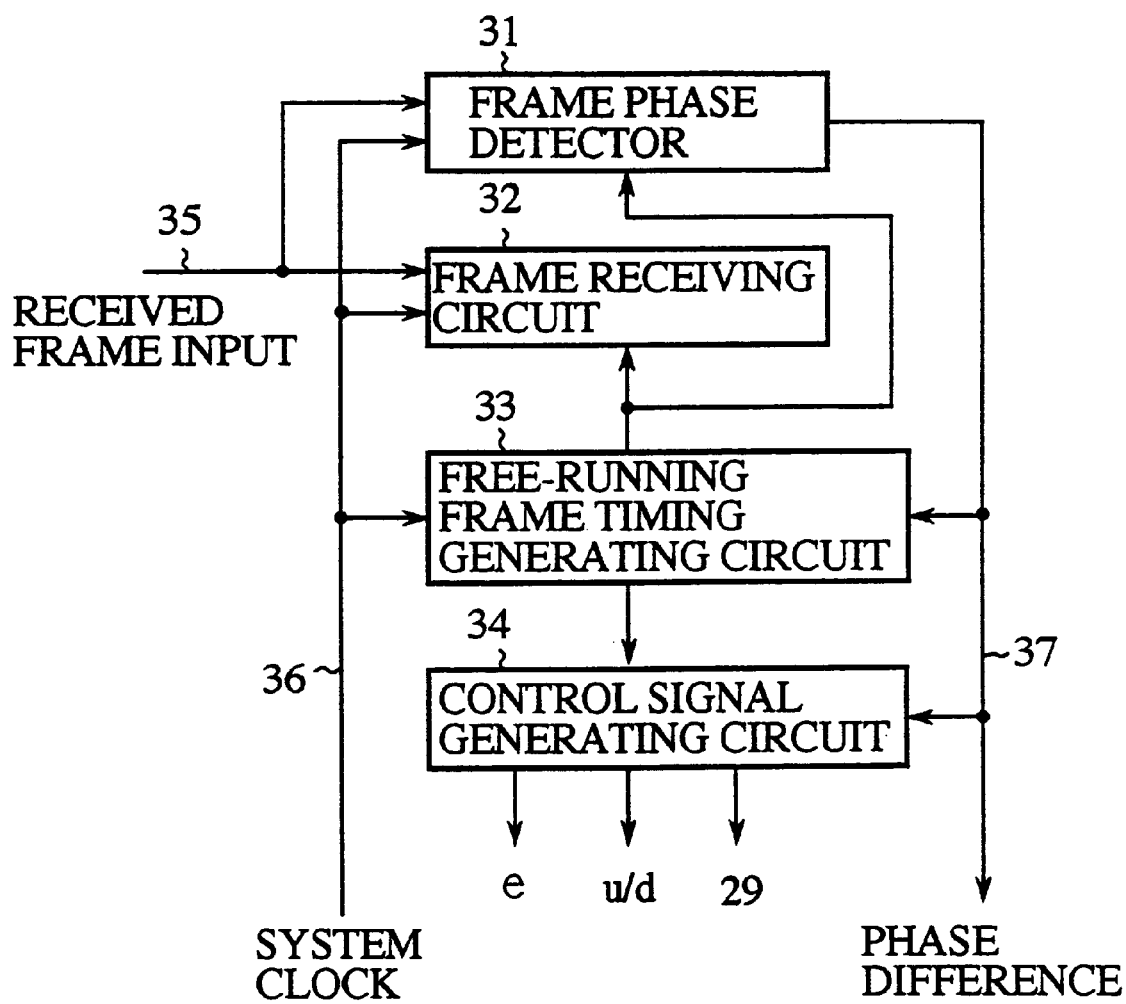
FIG. 10 is a block diagram illustrating the DPLL configuration used in FIGS. 5 and 7.

FIG. 10 illustrates in block form the DPLL 16. Reference numeral 31 denotes a frame phase detector that detects the timing of the received frame, then compares its phase with that of the free-running frame, and outputs information on the detected phase difference. Reference numeral 32 denotes a frame receiving circuit that takes in the frame received at the receiving timing generated from the free-running frame timing. Reference numeral 33 denotes a free-running frame timing generating circuit that generates the frame timing based on the oscillation frequency of the mobile station 112. The free-running frame timing generating circuit 33 uses the above-mentioned phase difference information to control the phase of the free-running frame timing with the precision of the system clock to approach the phase of the detected received frame. Reference numeral 34 denotes a control signal generating circuit that generates and outputs the enable signal e and the up-down signal u/d for the charge pump 24 based on information received from the free-running frame timing generating circuit 33 and information from the frame phase detector 31.

Reference numeral 35 denotes a signal line through which the received frame from the base station 111 is input into the frame phase detector 31 and the frame receiving circuit 32. Reference numeral 36 denotes a signal line through which the system clock is input into the frame phase detector 31, the frame receiving circuit 32 and the free-running frame timing generating circuit 33. Reference numeral 37 denotes a signal line through which the phase difference detected by the frame phase detector 31 is provided to the free-running frame timing generating circuit 33 and the control signal generating circuit 34.

Next, the operation of this embodiment will be described below.

The charge pump 24 receives, as control signals representing the current phase condition of the mobile station 112, the enable signal e and the up-down signal u/d via the signal line 20 from the DPLL 16. When it is determined that the phase of the mobile station 112 is leading that of the base station 111, the charge pump 24 discharges, i.e., outputs, electrical charge at the output terminal. In the reverse case, the charge pump 24 charges, i.e., absorbs, electrical charge at the output terminal 21. With such an arrangement, the voltage at the output terminal gradually increases when the phase is leading, whereas when the phase is lagging, the voltage gradually decreases. The voltage fluctuation characteristic at the output terminal 21 is controlled by the time constant of an external series connection of a resistor 26 and a capacitor 27 connected between the output terminal 21 and the outside ground level position 109 via an output pin 25.

The voltage fluctuation at the output terminal 21 brings about such an effect as described below. That is, the output terminal 21 is connected to the gates of the NchTr's 9 and 10, so that when the output terminal 21 is high-level, the capacitors 11 and 12 are connected via ON-state resistors of N the NchTr's 9 and 10 to the output pin 2 and the input pin 3, respectively, and the oscillation frequency drops to the lowest. Conversely, when the output terminal 21 is low-level, the NchTr's 9 and 10 are turned OFF and the capacitors 11 and 12 are completely disconnected from the output pin 2 and the input pin 3, causing the oscillation frequency to increase to the highest. When the potential at the output terminal is intermediate between the high and low levels, the NchTr's 9 and 10 are half in the ON state; that is, the oscillator 60 oscillates at a frequency intermediate between the values corresponding to the high and low levels at the output terminal 21.

As described above, according to Embodiment 4, continuous control of the electrical charge at the output terminal 21 permits the formation of a sort of analog PLL that continuously controls the oscillation frequency; hence, it is possible to minimize the deviation of the oscillation frequency from that of the base station 111.

Embodiment 5

In the Embodiment 1 described above, the capacitors 11a to 11d and 12a to 12d are merely connected via the NchTr's 9a to 9d and 10a to 10d, respectively. However, the potentials of the capacitors 11a to 11d and 12a to 12d are unpredictable, and according to the potential values, their operations change due to redistribution of electric charges that develop at the instant of the NchTr's turning ON, and predetermined characteristics cannot always be obtained. As a solution to this problem, a fifth embodiment (Embodiment 5) of the present invention employs a means for precharging the capacitors to an intermediate potential before the NchTr's turn ON.

Figure 11:
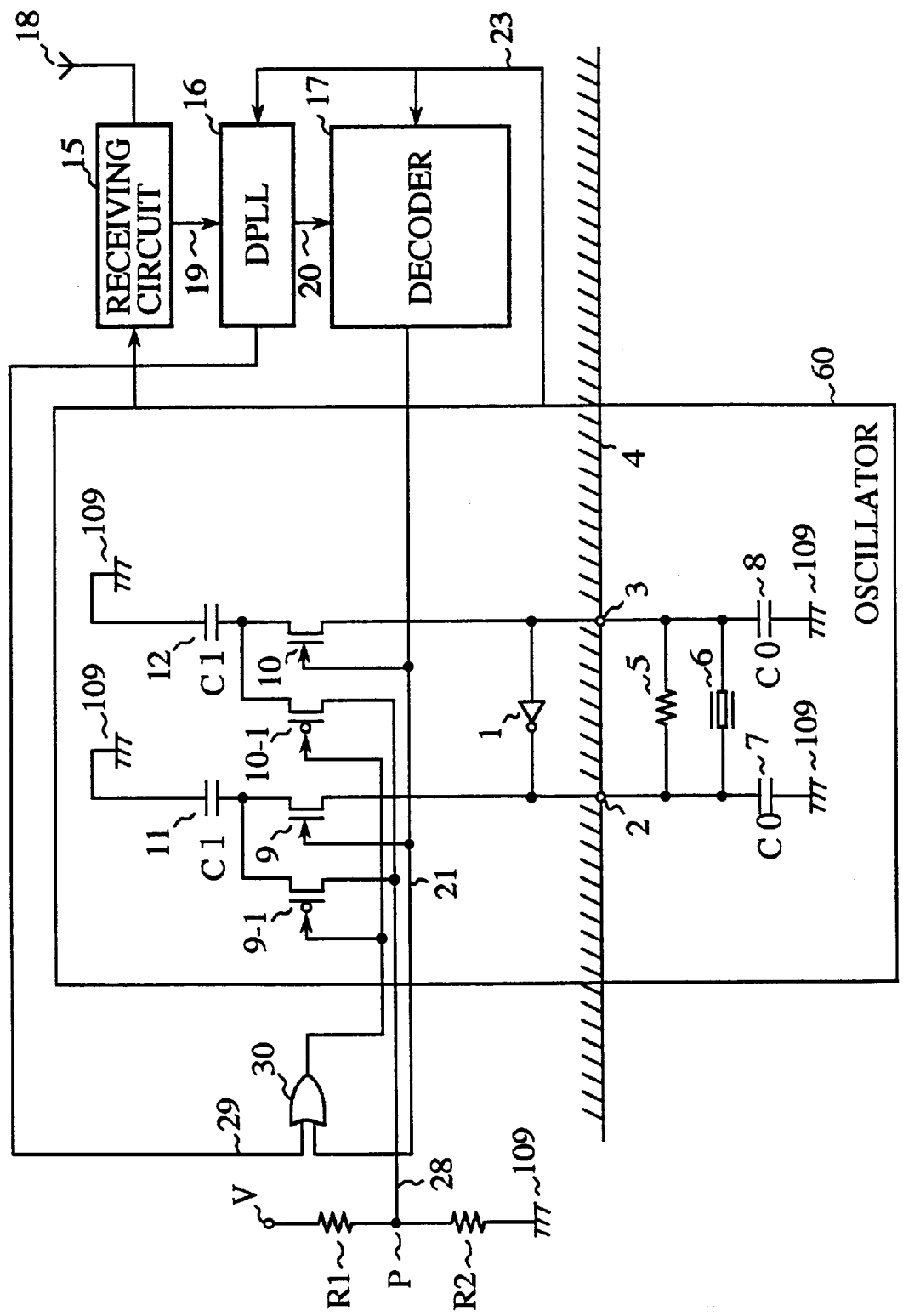
FIG. 11 is a circuit diagram illustrating the configuration of radio terminal equipment provided with an oscillator according to a fifth embodiment (Embodiment 5) of the present invention.

FIG. 11 is a circuit diagram illustrating the configuration of radio terminal equipment provided with an oscillator according to Embodiment 5. In FIG. 11, the eight NchTr's 9a to 9d and 10a to 10d and the eight capacitors 11a to 11d and 12a to 12d of FIG. 5 are shown only as a pair of transistors for brevity; reference numerals 9 and 10, and 11 and 12 represent quadruplets of NchTr's 9a to 9d and 10a to 10d, and quadruplets of capacitors 11a to 11b and 12a to 12d, respectively. In FIG. 11, reference numeral 28 denotes a signal line that holds an intermediate potential at all times. Resistors R1 and R2 of the same resistance value are connected in series between a power-supply terminal V and the ground level position 109. Reference numeral 29 denotes a signal line for transmitting therethrough control signals to the PchTr's 9-1 and 10-1. Reference numeral 30 denotes an OR gate.

In FIG. 11, identical reference numerals same as those shown in FIGS. 5 and 7 indicate the same elements as those shown in those previous Figures.

Next, the operation of this embodiment will be described below.

When the output terminal 21 is low-level, the NchTr's 9 and 10 are in the OFF state, holding the capacitors 11 and 12 disconnected from the output and input pins 2 and 3, respectively. In this instance, when the voltage that is provided to the signal line 29 from the DPLL 16 is made low-level, the PchTr's 9-1 and 10-1 are turned ON, through which the capacitors 11 and 12 are connected to the signal line 28, and hence they are charged to the intermediate potential.

Next, when the voltage from the DPLL 16 to the signal line 29 goes high, the PchTr's 9-1 and 10-1 are turned OFF. When the potential at the output terminal 21 goes higher, the NchTr's 9 and 10 are turned ON, through which the capacitors 11 and 12 precharged to the intermediate potential are connected to the output pin 2 and the input pin 3, respectively. The capacitors 11 and 12 can be disconnected from the output pin 2 and the input pin 3 simply by making the voltage on the signal line 29 high-level and then the potential at the output terminal 21 low-level.

As described above, according to Embodiment 5, since the capacitors 11 and 12 precharged to the intermediate potential at all times are connected to the oscillator, it is possible to avoid such an extreme or excessive redistribution of electric charges as is often observed when a capacitor charged to at least the low level is connected to a signal line of the high level or a capacitor charged to the high level is connected to a signal line of the low level. Further, by holding the signal line 28 equipotential to the oscillator and in phase therewith, not at the intermediate potential, it is possible to further suppress the electric charge redistribution and hence achieve more stable and more smooth switching of the capacitors.

Embodiment 6

The Embodiment 1 described above utilizes hard-wired logic for connection control of the capacitors 11a to 11d and 12a to 12d. On the other hand, a sixth embodiment (Embodiment 6) of the present invention employs a configuration in which the current phase condition of the mobile station 112 is indicated to a phase information register, and a microprocessor reads out its stored contents, then determines processing for the connection of the capacitors, and writes a desired control code in a frequency control register.

Figure 12:
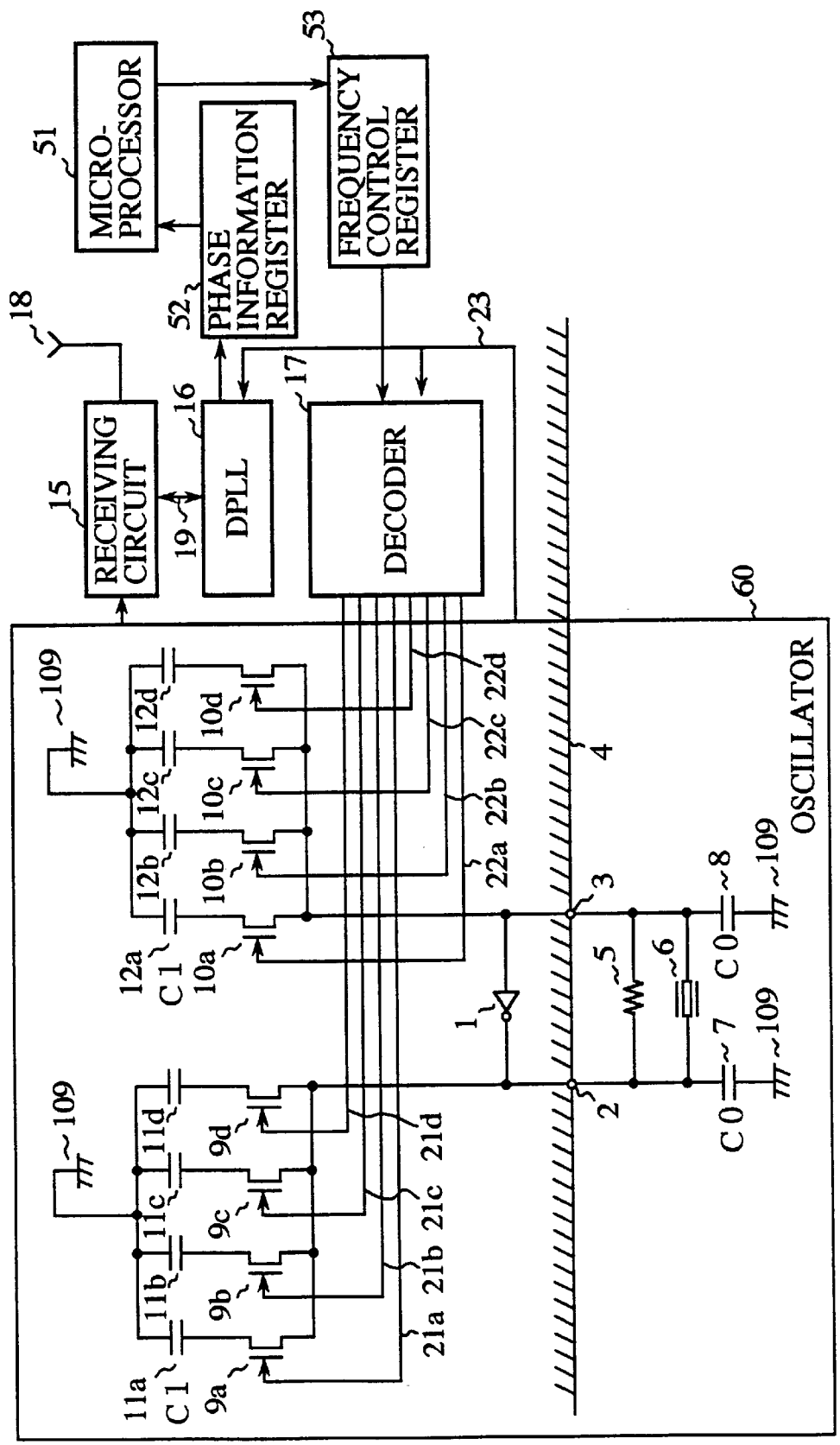
FIG. 12 is a circuit diagram illustrating the configuration of radio terminal equipment provided with an oscillator according to a sixth embodiment (Embodiment 6) of the present invention.

FIG. 12 illustrates in block form radio terminal equipment according to Embodiment 6 which utilizes a circuit configuration in which a microprocessor (decision means) 51 controls the oscillation frequency of the oscillator 60. In Embodiment 6, the DPLL 16 writes in a phase information register 52 information indicative of the phase difference between the detected received frame and the free-running frame timing. The microprocessor 51 reads out the stored contents of the phase information register 52, then decides an appropriate frequency control value, and writes it in a frequency control register 53. Based on the frequency control value received from the frequency control register 53, the decoder 17 effects ON/OFF control of the switches 9a to 9d and 10a and 10d connected to the capacitors 11a to 11d and 12a to 12d, thereby controlling the oscillation frequency.

In FIG. 12, identical reference numerals same as those shown in FIGS. 5, 7 and 11 indicate the same elements as those shown in those previous Figures.

As described above, according to Embodiment 6, it is possible to select an optimum frequency control method in accordance with the kind of the oscillator used and its temperature and voltage conditions. Accordingly, appropriate frequency control can be achieved in various cases, and hence the oscillation frequency can be controlled under more complicated conditions.

It is to be understood that although the preferred embodiments of the present invention have been described above, they are intended as being illustrative and not as limiting the invention specifically thereto, and that many modifications variations may be effected without departing from the spirits and scope of the claims appended hereto.

What is claimed is:

1. A radio terminal device including:
a radio signal receiving circuit for receiving a signal at a receiving frequency;
an oscillator producing an oscillation signal at an oscillation frequency and supplied to said radio signal receiving circuit;
a digital phase locked loop (DPLL) receiving an output signal from said radio signal receiving circuit for detecting phase difference between the receiving frequency of the signal received by said radio signal receiving circuit and the oscillation frequency of said oscillator, and producing a correction signal in resnse to the phase difference detected;
a capacitor selectably connectable within said oscillator for changing the oscillation frequency;
a first switch for connecting and disconnecting said capacitor within said oscillator;
a second switch connected between said capacitor and an intermediate potential; and
control means for alternatingly closing and opening said first and second switches in response to the correction signal produced by said DPLL.

2. The radio terminal device according to claim 1 comprising:
a plurality of capacitors selectably connectable within said oscillator for changing the oscillation frequency; and
a plurality of first switches, each of said first switches being connected to a corresponding one of said capacitors for selectively connecting and disconnecting said capacitors within said oscillator, wherein said control means selectively closes and opens said switches in response to the correction signal from said DPLL.

3. The radio terminal device according to claim 2, wherein said capacitors have capacitance values differing in steps of C/2n, where C is a capacitance value and n is an integer.

4. The radio terminal device according to claim 1, wherein said first and second switches are semiconductor switching elements for continuously changing a current flowing through said first and second semiconductor switching elements.

5. A radio terminal device including:

a radio signal receiving circuit for receiving a signal at a receiving frequency;

an oscillator producing an oscillation signal at an oscillation frequency and supplied to said radio signal receiving circuit;

a digital phase locked loop (DPLL) receiving an output signal from said radio signal receiving circuit for detecting phase difference between the receiving frequency of the signal received by said radio signal receiving circuit and the oscillation frequency of said oscillator;

a capacitor selectably connectable within said oscillator for changing the oscillation frequency;

a switch for connecting and disconnecting said capacitor within said oscillator;

a register for storing the phase difference detected by said DPLL;

decision means for reading the phase difference stored in said register and determining a frequency control value; and control means for closing and opening said switch in response to the frequency control value from said decision means.

6. The radio terminal device according to claim 5 comprising:

a plurality of capacitors selectably connectable within said oscillator for changing the oscillation frequency; and a plurality of switches, each of said switches being connected to a corresponding one of said capacitors for selectively connecting and disconnecting said capacitors within said oscillator, wherein said control means selectively closes and opens said switches in response to the correction signal from said DPLL.

7. The radio terminal device according to claim 6, wherein said capacitors have capacitance values differing in steps of C/2n, where C is a capacitance value and n is an integer.

8. The radio terminal device according to claim 5, wherein said switch is a semiconductor switching element for continuously changing a current flowing through said semiconductor switching element.

* * * * *